(12) United States Patent
Wagner et al.

(10) Patent No.: US 8,811,015 B2
(45) Date of Patent: Aug. 19, 2014

(54) MOTOR CONTROL DEVICE

(75) Inventors: Jon Wagner, Belmont, CA (US); Trevor James Edmonds, San Francisco, CA (US); Derek Bruce Young, San Francisco, CA (US)

(73) Assignee: Mission Motor Company, San Francisco, CA (US)

( * ) Notice: Subject to any disclaimer, the term of this patent is extended or adjusted under 35 U.S.C. 154(b) by 239 days.

(21) Appl. No.: 13/398,695

(22) Filed: Feb. 16, 2012

(65) Prior Publication Data
US 2013/0215573 A1 Aug. 22, 2013

(51) Int. Cl.
*H05K 7/20* (2006.01)
(52) U.S. Cl.
USPC ........... 361/702; 361/689; 361/699; 165/80.4
(58) Field of Classification Search
None
See application file for complete search history.

(56) References Cited

U.S. PATENT DOCUMENTS

| | | | |
|---|---|---|---|
| 4,413,218 A | 11/1983 | Taylor et al. | |
| 5,966,291 A * | 10/1999 | Baumel et al. | 361/707 |
| 6,529,394 B1 | 3/2003 | Joseph et al. | |
| 7,193,385 B2 | 3/2007 | Emadi et al. | |
| 7,755,898 B2 * | 7/2010 | Aoki et al. | 361/710 |
| 7,760,503 B2 * | 7/2010 | Aoki et al. | 361/699 |
| 7,978,468 B2 * | 7/2011 | Nakatsu et al. | 361/689 |
| 7,978,471 B2 * | 7/2011 | Tokuyama et al. | 361/699 |
| 8,169,780 B2 * | 5/2012 | Yoshino et al. | 361/699 |
| 8,422,230 B2 * | 4/2013 | Aiba et al. | 361/704 |
| 8,441,827 B2 * | 5/2013 | Baker et al. | 363/141 |
| 2005/0276082 A1 | 12/2005 | Panda et al. | |
| 2010/0128410 A1 | 5/2010 | Lee et al. | |
| 2010/0128437 A1 | 5/2010 | Groppo et al. | |
| 2010/0183457 A1 | 7/2010 | Hattori et al. | |
| 2010/0195286 A1 | 8/2010 | Dhawan et al. | |
| 2011/0116235 A1 * | 5/2011 | Ryu et al. | 361/699 |

* cited by examiner

*Primary Examiner* — Boris Chervinsky
(74) *Attorney, Agent, or Firm* — Jeffrey Schox; Diana Lin

(57) ABSTRACT

A motor controller comprising an inverter module including an inverter circuit coupled to a baseplate, wherein the baseplate includes cooling features; a cooling channel configured to receive a cooling fluid, wherein the cooling features extend into the cooling channel; a capacitor; and a laminated bus electrically coupling the capacitor to the inverter circuit and thermally coupling the capacitor to the cooling channel.

21 Claims, 9 Drawing Sheets

MOTOR CONTROL DEVICE

TECHNICAL FIELD

This invention relates generally to the electric motor field, and more specifically to an improved motor controller in the electric motor field.

BACKGROUND

Motor controllers that control the speed of an electric motor by controlling the frequency of AC power provided to the motor are highly desirable for electric motor applications. These motor controllers are particularly desirable in electric vehicle applications, wherein control over the motor speed may directly affect vehicle operation. Motor controllers typically function by converting single-phase battery power into three-phase AC power, wherein the frequency of the AC power controls the motor rotation speed. However, the large amount of power that needs to be converted to power suitable for the motor tends to heat the components of the motor controller, which may lead to component overheating and subsequent failure. Furthermore, it is desirable to minimize the size and weight of the motor controller to allow for lighter and smaller vehicles. Thus, there is a need in the electric motor field to create a motor controller with improved thermal management in a small form factor.

DESCRIPTION OF THE PREFERRED EMBODIMENTS

The following description of the preferred embodiments of the invention is not intended to limit the invention to these preferred embodiments, but rather to enable any person skilled in the art to make and use this invention.

Figure 1A:
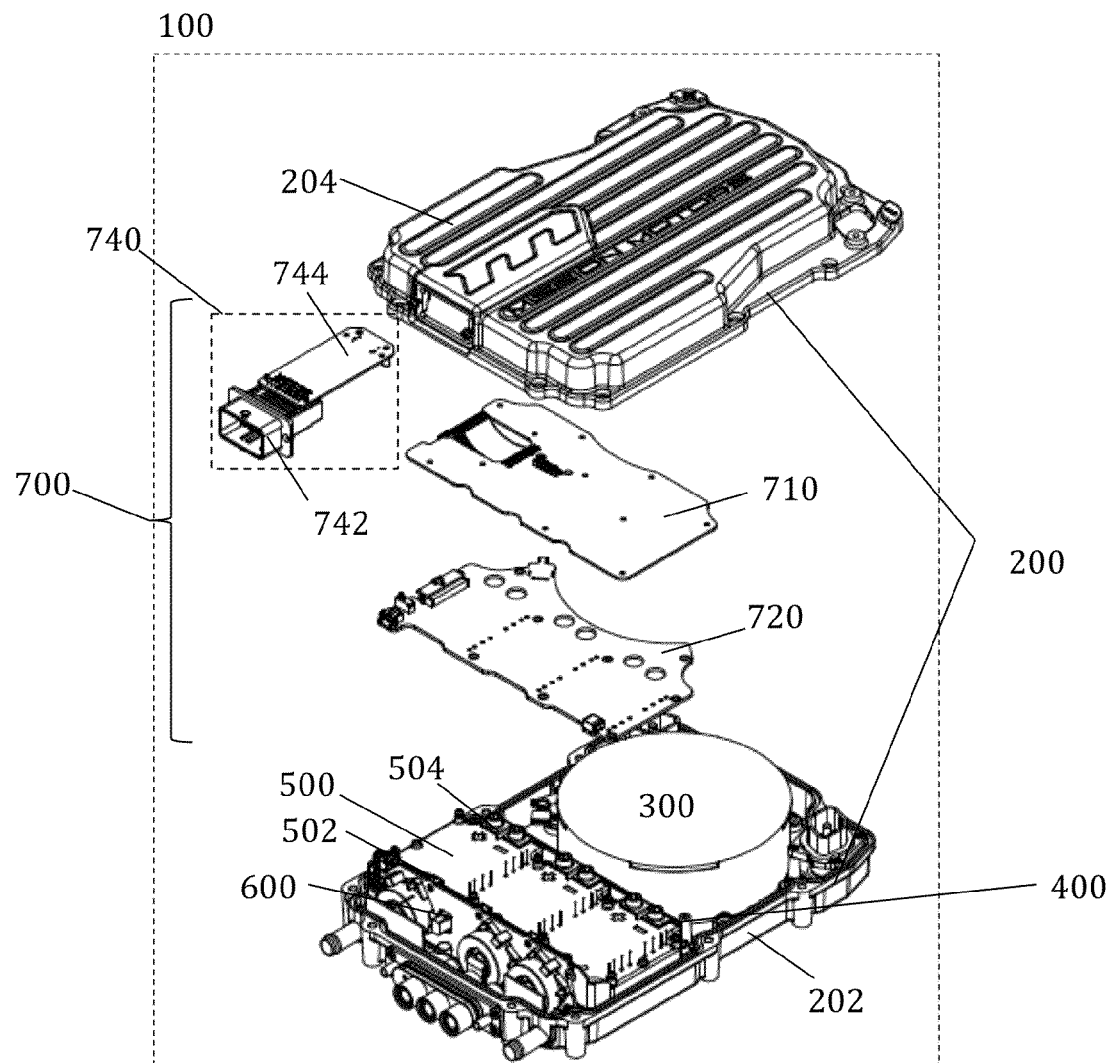
FIGS. 1A and 1B are an exploded view of the motor controller and a view of an assembled motor controller, respectively.
Figure 1B:
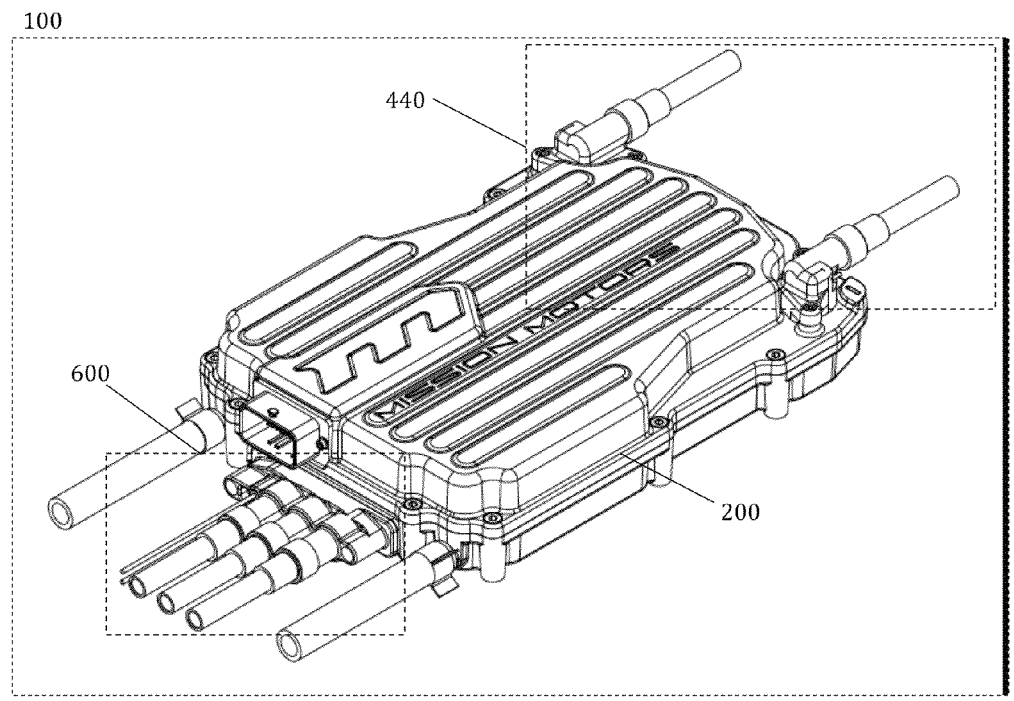

As shown in FIG. 1, the motor controller 100 includes a case 200 enclosing an inverter module 500 including an inverter circuit 520 and a baseplate 540; a capacitor 500; a laminated bus 400 connecting the capacitor 300 and inverter circuit 520; and a cooling channel 220. The motor controller 100 is preferably configured to control and convert input power into power suitable for a multi-phase load (e.g. three-phase load), but may be configured to control and convert power from any suitable source for any suitable application. In one embodiment, the motor controller 100 converts DC power from a battery into three-phase AC power for an AC electric motor. The motor controller 100 is additionally configured to provide improved thermal management for the inverter circuit 520, but may alternatively/additionally provide improved thermal management for the capacitor 300 and/or any associated electronics.

In operation, the motor controller 100 receives power from a power source (e.g. a battery) on the laminated bus 400, transfers the power over the laminated bus 400 to the capacitor 300, which smoothes the input current, and transfers the power over the laminated bus 400 to the inverter module 500. The inverter circuit 520 of the inverter module 500 converts the single-phase input power into a multi-phase output power (e.g. DC power into 3-phase AC power), which is subsequently supplied to a power-consuming load (e.g. an AC motor) through a power connector 600. The motor controller 100 preferably controls the amount of power pulled (and subsequently, supplied) and the frequency of the output power based on the load state. In one embodiment, the motor controller 100 controls the switching characteristics (e.g. switching speed, frequency, etc.) of the inverter circuit 520 based on a desired torque value and one or more motor parameters. The motor parameters are preferably the present and/or substantially instantaneous motor position, speed, acceleration, or temperature, but may be desired motor parameters (e.g. desired motor speed or acceleration) or any other suitable measurement indicative of motor operation.

To manage motor controller operation, the motor controller 100 may include control circuitry 710. The motor controller 100 preferably includes a control circuit 710, a gate driver circuit 720, and a signal circuit 744, wherein the circuits are preferably located on separate PCBs, but may alternatively be located on a single or multiple PCBs. In operation, the signal circuit 744 receives information indicative of past, present and/or future operation of the load (e.g. motor), which is sent to the control circuit 710. The control circuit 710 processes the received data into gate driver instructions, which is subsequently sent to the gate driver. The gate driver controls the inverter circuit 520 switching characteristics based on the received instructions.

Figure 2:
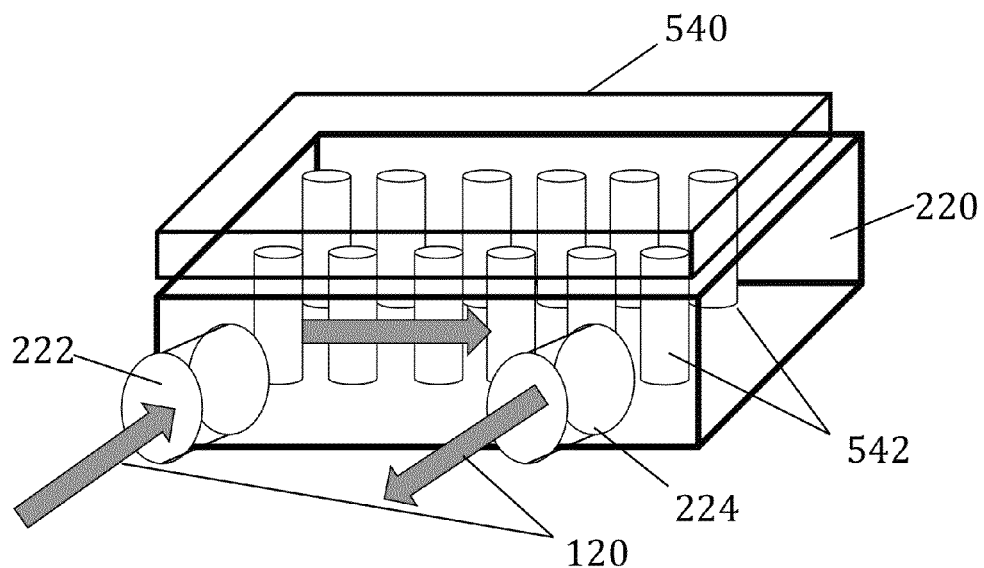
FIG. 2 is a schematic representation of a first embodiment of cooling fluid flow through the cooling channel.

As the inverter circuit 520 converts input power into output power, the inverter module 500 may increase in temperature, which may result in failure of the motor controller 100. To regulate this temperature increase, the motor controller 100 is configured to cool the inverter circuit 520 through the cooling features of the baseplate 540. More specifically, the inverter circuit 520 is thermally coupled to the baseplate 540, which conducts heat away from the inverter circuit 520 through cooling features on the baseplate base. As shown in FIG. 2, the cooling features are thermally coupled to the cooling channel 220, wherein cooling fluid flow through the cooling channel 220 absorbs and removes heat from the motor controller 100. The motor controller 100 may additionally be configured to regulate the temperature of the capacitor 300, wherein the capacitor 300 is thermally coupled to the cooling channel 220. In one embodiment, the capacitor 300 is thermally coupled to the cooling channel 220 by the laminated bus 400, wherein the laminated bus 400 terminates on a portion of the cooling channel 220. In a second embodiment, a portion of the cooling channel 220 extends through the case below the capacitor 300. In a third embodiment, a portion of the cooling channel 220 extends along the walls of the case surrounding the capacitor 300. In a fourth embodiment, the capacitor 300 is immersed within the cooling fluid 120. Alternatively, other capacitor 300 cooling mechanisms may be envisioned within the scope of this invention.

The cooling fluid 120 functions to absorb and remove heat from the motor controller 100. The cooling fluid 120 is preferably a water-glycol mixture, but may alternatively be water, refrigerant, air, or any other suitable fluid. The cooling fluid 120 preferably flows through the cooling channel 220, but may alternatively flow through other portions of the motor controller 100 as well. The cooling fluid 120 preferably flows in one direction through the cooling channel 220, but may alternatively be cross-flowed through the motor controller 100. The cooling fluid 120 is preferably shared with the motor that is controlled by the motor controller 100, but may alternatively be cooled using a separate cooling fluid 120. In one embodiment, the cooling fluid 120 is passed through the motor controller 100 before cooling the motor. In a second embodiment, heated cooling fluid 120 from the motor flows through the motor controller 100. The cooling fluid 120 is preferably provided from a reservoir, but may alternatively be stored within the motor or in any other suitable fluid source. In operation, the cooling fluid flows into the cooling channel 220 within the motor controller 100 through an inlet 222, flows across the cooling features of the baseplate 540, and flows out of the cooling channel 220 and motor controller 100 through an outlet 224.

The power source functions to supply power for the multi-phase load. The power source is preferably a battery, but may alternatively be a fuel cell system (e.g. a hydrogen, propane, or methane system), a wall socket, or any other suitable power source. The power source preferably supplies single-phase power, but may alternatively have any suitable number of phases. The battery is preferably a battery pack made up of multiple battery cells coupled in series or in parallel, but may alternatively be a single battery cell or multiple battery packs coupled in series or in parallel. The battery cell is preferably rechargeable, and may be a lithium ion, lithium polymer, nickel cadmium, or any other suitable battery chemistry; while each battery pack is preferably made from the same battery cell type, battery packs may include a mix of battery cell types.

The multi-phase load functions to consume the power provided by the power source. The multi-phase load is preferably a three-phase AC motor (alternator), but may alternatively be a two-phase load (e.g. any load that accepts an alternating current), a four-phase load (e.g. a four-pole motor), or any other suitable load that accepts any suitable number of current phases. The three-phase motor preferably functions to convert electric power to mechanical power, and may be utilized with the motor controller 100 within a vehicle (e.g. automobile, motorcycle, tractor, snowmobile, etc.), or any other suitable machinery. The motor preferably receives multi-phase power from the motor controller 100, wherein the speed of motor rotation is preferably dependent on the frequency of the power output of the motor controller 100. The motor preferably includes a rotor or armature that rotates within a stator, and is preferably cooled with a cooling fluid 120 (e.g. about the exterior of the stator, between the stator and the rotor, or within the rotor), which may or may not be the same cooling fluid 120 as that of the motor controller 100.

As previously described, the motor controller 100 includes a case 200 enclosing an inverter module 500, a capacitor 300, a laminated bus 400 connecting the capacitor 300 and inverter module 500. The motor controller 100 may additionally include a control circuit 710, a gate driver circuit 720, a signal circuit 744, and any other associated circuitry.

Figure 3:
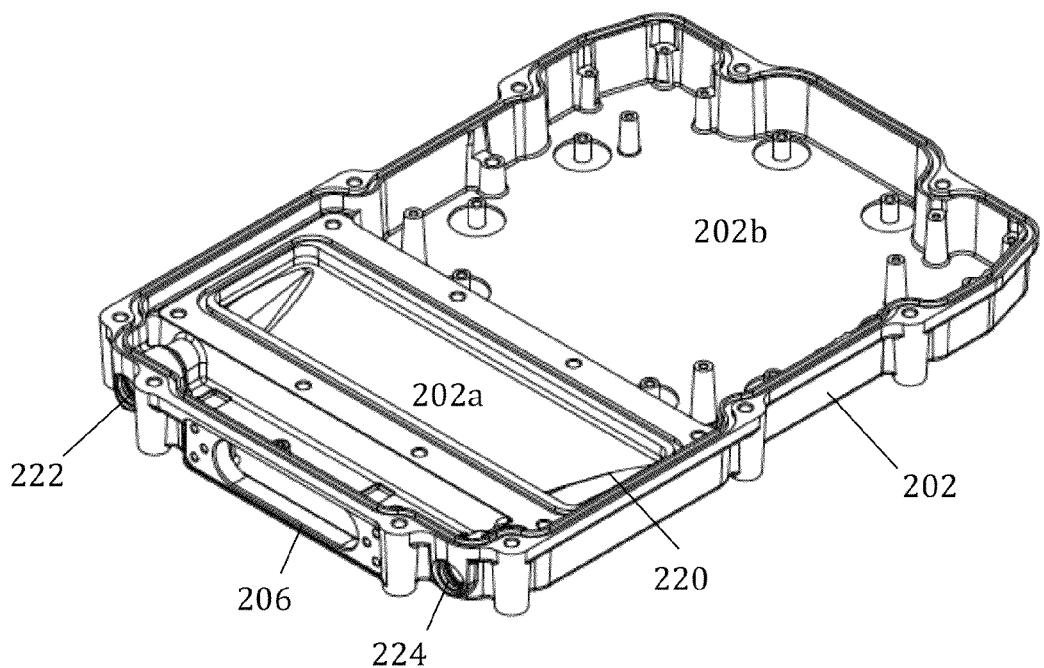
FIG. 3 is a schematic representation of the case base with a first cooling channel embodiment.

As shown in FIG. 1, the case 200 of the motor controller 100 functions to mechanically protect the components of the motor controller 100. The case 200 preferably includes a base 202 and a lid 204. The lid 204 preferably couples to the base 202 through a plurality of screws along the case 200 perimeter, but may alternatively clip onto the base 202, be adhered onto the base 202, or be coupled to the base 202 through any suitable mechanism. The case 200 may additionally include a groove along the join between the base 202 and lid 204 (e.g. case 200 perimeter) that receives a gasket to form an improved seal. The case 200 is preferably a substantially flat, rectangular prism with rounded edges, but may alternatively be any suitable shape. The case 200 is preferably slightly wider than the inverter module 500 length and/or capacitor 300 diameter, is preferably slightly longer than the sum of the width of the inverter module 500 and the diameter of the capacitor 300, and is preferably slightly taller than the height of the capacitor 300. However, the case 200 may have any suitable dimensions. The base 202 preferably includes mounting points for the motor controller 100 components and defines the cooling channel 220, and the lid 204 may also include mounting points for components. As shown in FIG. 3, the case interior is preferably divided along the case 200 length into an inverter module portion 202a and a capacitor portion 202b. The inverter module portion 202a is preferably located substantially adjacent a transverse side of the case 200, and is preferably dimensioned such that a longitudinal edge of the inverter module 500 is parallel with the transverse case 200 edge when the inverter module 500 is coupled to the case 200. The capacitor portion 202b is preferably the remaining portion of the case interior, and is preferably dimensioned slightly larger than the capacitor 300 (i.e. with a width and length slightly larger than the diameter of the capacitor 300). The division is preferably physically delineated, wherein a barrier within the case interior substantially as tall as the cooling channel height fluidly divides the case interior into the two portions. In some embodiments, the barrier forms a wall of the cooling channel 220. However, the division may be indicated by mounting points, case 200 features in the wall (e.g. grooves), or may not be delineated by the case 200 at all. The case 200 is preferably made of a thermally conductive material, such as aluminum, copper, or stainless steel, but may alternatively be made of a polymer, ceramic, or any combination thereof. The case 200 is preferably cast, but may alternatively be machined, sintered, stamped, welded together, or manufactured using any suitable method.

Figure 4:
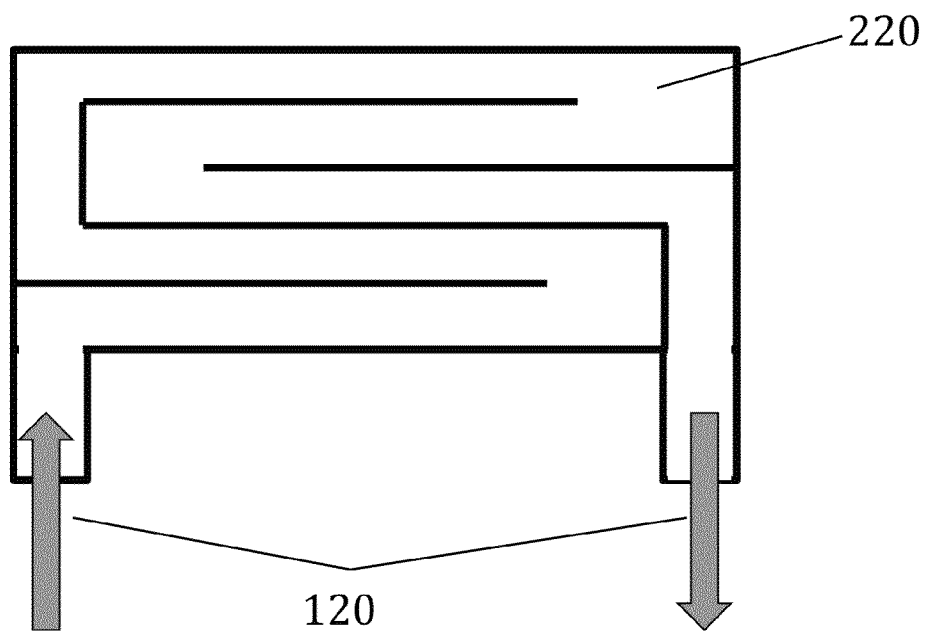
FIG. 4 is a schematic representation of a second cooling channel embodiment.

The case 200 may additionally function to cool the contained components. More preferably, the case 200 defines a portion of the cooling channel 220. This cooling channel 220 functions to receive and facilitate cooling fluid flow below the inverter module 500, but may additionally function to cool the capacitor 300 and/or other components of the motor controller 100. The inverter module baseplate 540 and a portion of the case 200 preferably cooperatively define the cooling channel 220. The baseplate 540 is preferably coupled to the perimeter of the cooling channel 220 by screws, but may alternatively be coupled by clips, adhesive, or any other suitable coupling mechanism. The cooling channel 220 is preferably defined along a transverse case face and along a portion of the case 200 length, but may alternatively be defined in any suitable position within the case interior. The cooling channel 220 includes an inlet 222 and an outlet 224, and is configured to receive and facilitate cooling fluid flow therethrough. The inlet 222 and outlet 224 are preferably located on the same wall of the cooling channel 220 such that fluid ingress and egress are perpendicular to the cooling channel wall, but the inlet 222 or outlet 224 may alternatively be located on opposing walls or on adjacent walls. The inlet 222 and outlet 224 preferably extend through a transverse face of the case base 202, but may alternatively extend through any suitable portion of the case 200. The cooling channel 220 is preferably a single, straight, wide channel (e.g. a reservoir, as shown in FIG. 3), but may alternatively be a single, boustrophedonic channel (as shown in FIG. 4), multiple parallel channels that facilitate uni-directional flow, multiple channels that facilitate cross-flow, or any other suitable cooling channel 220 configuration. The cooling channel 220 preferably has the substantially the same footprint (e.g. length and width) as the inverter module 500, but may alternatively be larger or smaller. The cooling channel height is preferably dimensioned such that the combined height of the inverter module 500 and cooling channel 220 is substantially approximate to or shorter than the capacitor 300 height. However, the channel height may be any suitable height to facilitate adequate heat removal from the inverter module 500 and/or motor controller 100. The cooling channel 220 is preferably a substantially rectangular prismatic trough, but may alternatively be a rounded trough with a rectangular cross section, or any other suitable shape. In one embodiment, the cooling channel 220 is a rectangular reservoir, wherein the floor (i.e. face perpendicular to the vertical walls) is angled upwards away from the inlet 222 and outlet 224 towards the opposing wall. In a variation of this embodiment, the transition between the sidewalls (the walls perpendicular and adjacent to the inlet 222/outlet 224 wall and the opposing wall) and the angled floor is sloped or curved to facilitate better laminar fluid flow. The cooling channel 220 may also extend into the capacitor portion 202b, wherein the cooling channel 220 may be defined within the thickness of the case base 202 (e.g. along the base 202 floor or the base 202 walls), or may simply be the volume defined by the case base 202 (e.g. wherein the capacitor 300 is immersed in cooling fluid 120). As aforementioned, the cooling channel 220 is preferably cooperatively formed by the case base 202 and the inverter module baseplate 540. The case 200 preferably defines five sides of the cooling channel 220 (cooling channel 220 floor and four walls), but may alternatively define the walls of multiple channels, or any other suitable portion of the cooling channel 220. In one embodiment, the case base 202 is manufactured with raised dividers within the case interior that define the cooling channel walls. In a second embodiment, the case 200 receives an insert that forms the walls of the cooling channel 220, wherein the insert couples to mounting points within the case interior.

As shown in FIG. 3, the case 200 may additionally define the inlet 222 and outlet 224 of the cooling channel 220, and/or may define power connection ports. The inlet 222 and outlet 224 function to allow cooling fluid 120 ingress and egress from the cooling channel 220, respectively, and are preferably fluidly coupled to the cooling channel 220. The inlet 222 and outlet 224 are preferably ports within the case 200 and accept hose barb fittings, but may alternatively be hose barbs manufactured as a portion of the case 200, cylinders, or any other suitable feature that may mechanically couple to a fluid transfer mechanism (e.g. a hose). The inlet 222 and outlet 224 may additionally include fluid manifolds that extend through the case interior to the cooling channel 220. The inlet 222 and outlet 224 preferably couple to inlet 222 and outlet 224 hoses, which fluidly couple to a cooling fluid 120 source. The source of the cooling fluid 120 is preferably a reservoir of cooling fluid 120, but may alternatively be any suitable fluid source. The power connection port functions to facilitate multi-phase power output from the motor controller 100. The power connection port is preferably a port through a sidewall of the case base 202, more preferably through a transverse wall of the case base 202, but may alternatively be a port through a longitudinal wall, through the case lid 204, or located in any suitable position of the case 200. The power connector port 206 is preferably configured to receive an AC connector 603, and supports bus bar 601 coupling to the AC connector 603. The power connector port 206 preferably includes a fluid isolation mechanism that fluidly isolates a portion of the case interior from the cooling channel 220. The fluid isolation mechanism is preferably a fluid barrier within the case base 202 (e.g. a raised divider in the base 202, an insert fluidly sealed against the base 202, etc.), but may alternatively be any suitable isolation mechanism. In one variation, the fluid isolation mechanism is a wall of the cooling channel 220, wherein the case 200 includes a space between the cooling channel 220 and the transverse case wall. In one embodiment of the case 200, the case 200 defines a cooling channel inlet 222 and a cooling channel outlet 224 on opposing corners of a transverse case face with a power connection port located therebetween (e.g. on the same face). In this embodiment, the inlet hose, outlet hose, and AC connector 603 preferably extend perpendicularly from the case wall, but may alternatively extend at any suitable angle. In one variation, the transverse face in which the inlet 222, outlet 224, and connection port are defined is the transverse case face adjacent the cooling channel 220.

The capacitor 300 of the motor controller 100 functions to smooth the input current from the power source. More specifically, the capacitor 300 receives the input power from the laminated bus 400, smoothes the input current, and transfers the smoothed power over the laminated bus 400 to the inverter module 500. The capacitor 300 preferably has a capacitance such that the transferred power has a voltage substantially similar to the desired output voltage (e.g. the load voltage), but may have a capacitance such that the transferred power has a voltage substantially similar to the input voltage, or any other suitable capacitance. The capacitor 300 is preferably a fixed capacitor 300, but may alternatively be a variable capacitor 300. The capacitor 300 is preferably a film capacitor 300 (e.g. PET, polystyrene, polycarbonate plastic, polysulphone plastic, PTFE fluorocarbon, metalized plastic, etc.), but may be a ceramic capacitor 300, an electrolytic capacitor 300, or any other suitable capacitor 300. The capacitor 300 is preferably located in the capacitor portion 202b of the base 202 (e.g. along a longitudinal edge of the inverter module 500), but may alternatively be located in any suitable location.

Figure 5:
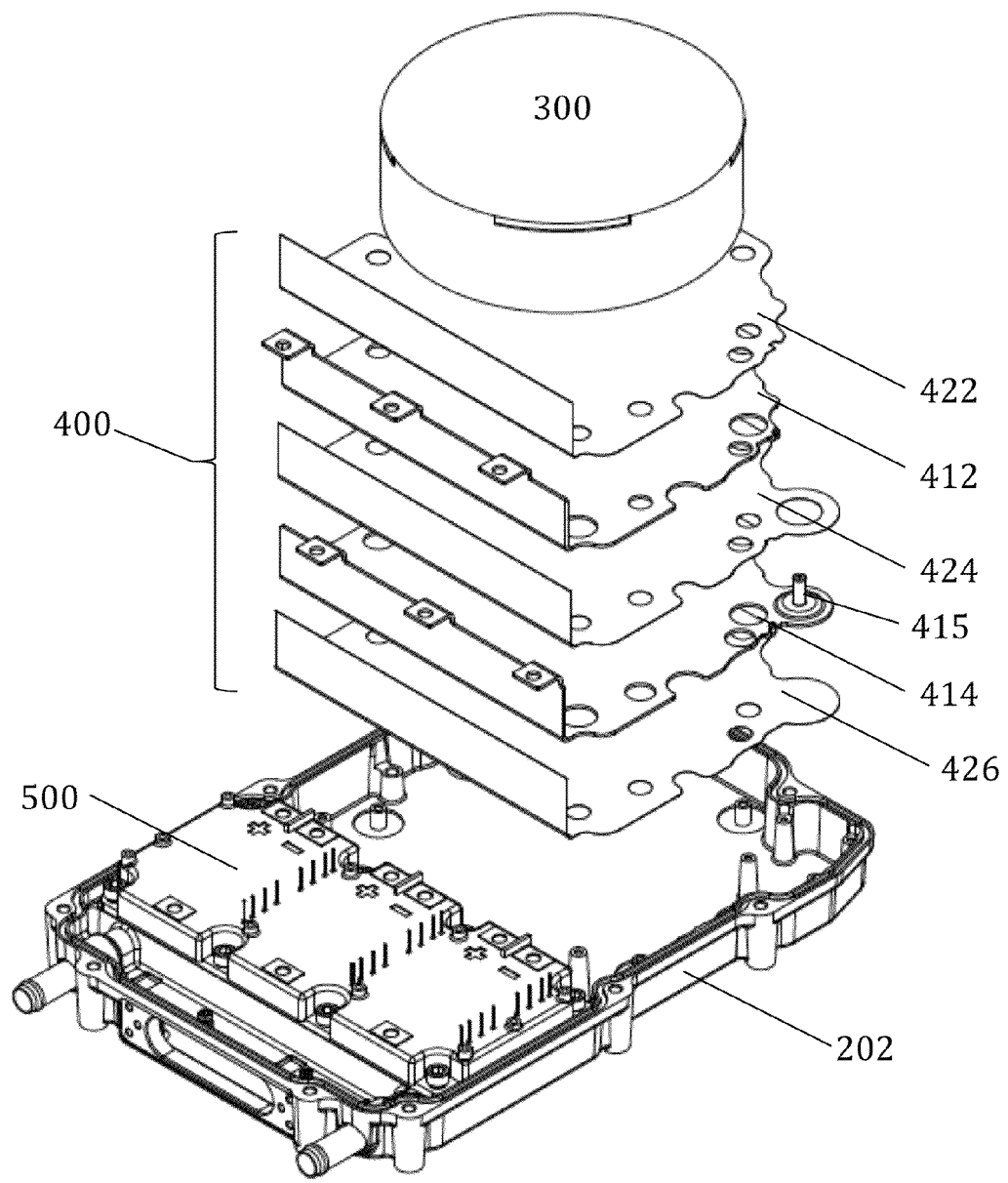
FIG. 5 is an exploded view of an embodiment of the laminated bus.
Figure 6:
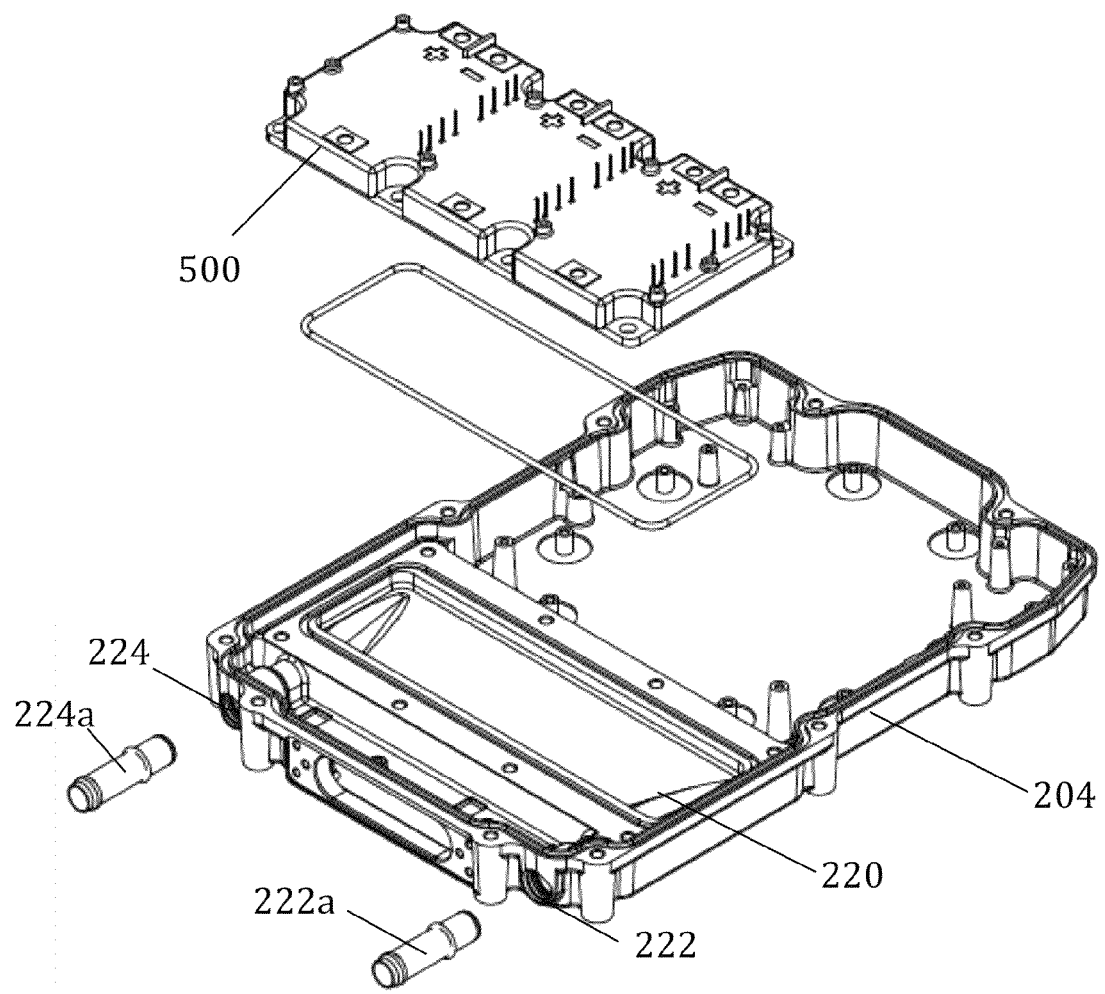
FIG. 6 is an exploded view of the cooling channel.

The laminated bus 400 of the motor controller 100 functions to conduct current from a power input 440 to the capacitor 300, and from the capacitor 300 to the inverter module 500. The laminated bus 400 may additionally function to cool the capacitor 300. The laminated bus 400 preferably has low inductance and low resistance, and preferably has a high thermal conductivity. The laminated bus 400 is electrically coupled to the capacitor 300 such that the power input 440, capacitor 300, and inverter circuit 520 are coupled together in parallel. However, the laminated bus 400 may couple the capacitor 300 to the power source and/or inverter circuit 520 in any suitable configuration. As shown in FIG. 5, the laminated bus 400 preferably includes two conductive layers (a top and a bottom conductive layer, corresponding to a positive and negative bus, 412 and 414, respectively) interposed between three insulating layers (a top, middle, and bottom insulating layer, 422, 424, and 426, respectively), such that the insulating layers and conductive layers alternate. However, the laminated bus 400 may alternatively include more insulating and/or conductive layers. The conductive layers each preferably include a conductor pin 415. In one embodiment, the pins are located in adjacent corners of the laminated bus end (e.g. the pin of a first conductive layer is located on a different corner that is adjacent the pin corner of the second conductive layer). The conductive layers are preferably metal, and may be copper, aluminum, or any suitable electrically conductive material. The insulating layers are preferably electrically insulating, more preferably electrically insulating but thermally conductive, and may be made of a polymer such as polyethylene terephthalate (PET, commercially known as Mylar), a ceramic, a combination thereof, or any other suitable insulating material. The insulating material thickness is preferably between 0.005"-0.010" for optimal thermal resistance and electrical insulation, but may alternatively be any suitable thickness. The conductive and insulating layers are preferably laminated together, but may alternatively be screwed together, stacked, or otherwise coupled.

The two conductive layers of the laminated bus 400 are preferably each coupled to a different terminal of the capacitor 300, respectively. In one embodiment, the terminals of the capacitor 300 extend underneath the capacitor 300, and the bus-capacitor 300 connections are made underneath the capacitor 300. In one variation of this embodiment, the terminals have different lengths, wherein the shorter terminal extends through the top insulation layer to couple to a first conductive layer, and the longer terminal extends through the top insulation layer, first conductive layer, and middle insulation layer to couple to the second conductive layer. In a second variation, the capacitor 300 terminals are substantially flat pads on the capacitor 300 end, wherein connectors extend from the conductive layers to meet the terminal pads. The laminated bus 400 is preferably soldered to the capacitor 300 terminals, but may alternatively be welded, clipped (e.g. with a conductive clip), or utilize any other suitable electrical coupling mechanism.

In an assembled motor controller 100, the capacitor 300 preferably rests on top of the laminated bus 400, wherein the laminated bus 400 preferably couples to the power input 440 at one transverse edge of the case 200, extends underneath the capacitor 300 to the inverter module 500, and couples to the terminals of the inverter module 500. In one embodiment, the laminated bus 400 extends underneath the capacitor 300 to the cooling channel 220, and extends vertically along a cooling channel wall to couple to the inverter module 500 terminals. This embodiment has the additional benefit of additional heat transfer between the cooling channel 220 and capacitor 300 through the vertical laminated bus segment. However, the laminated bus 400 may extend over the capacitor 300 (e.g. between the capacitor 300 and the case lid 204), extend along a case wall, or traverse the case 200 in any suitable configuration. During assembly, the laminated bus 400 may first be coupled to the capacitor 300, then the bus-capacitor 300 assembly may be coupled to the case base 202. Alternatively, the laminated bus 400 may be first coupled to the case base 202, and the capacitor 300 coupled to the laminated bus 400 afterward.

Figure 8:
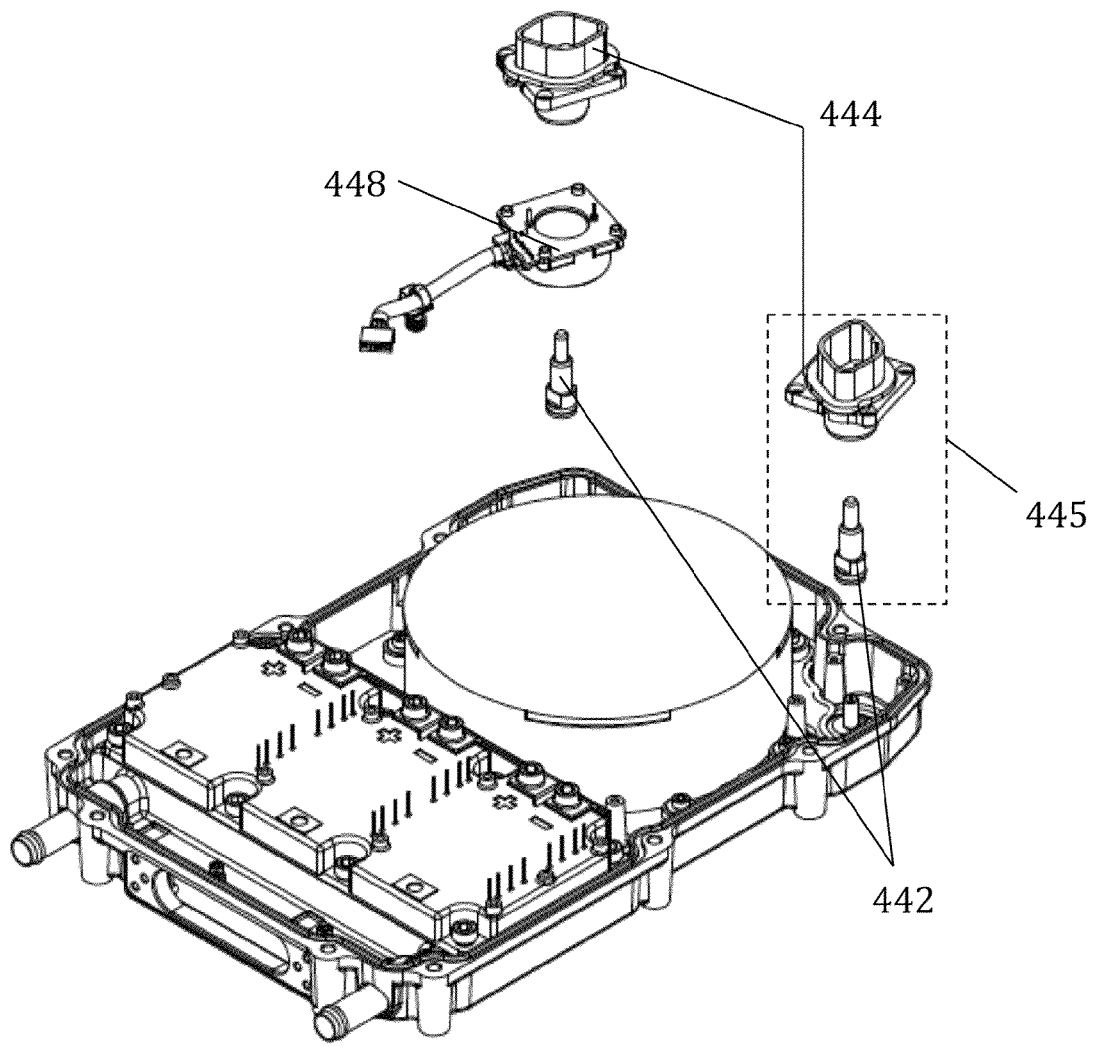
FIG. 8 is an exploded view of an embodiment of the male connector of the power input.
Figure 9:
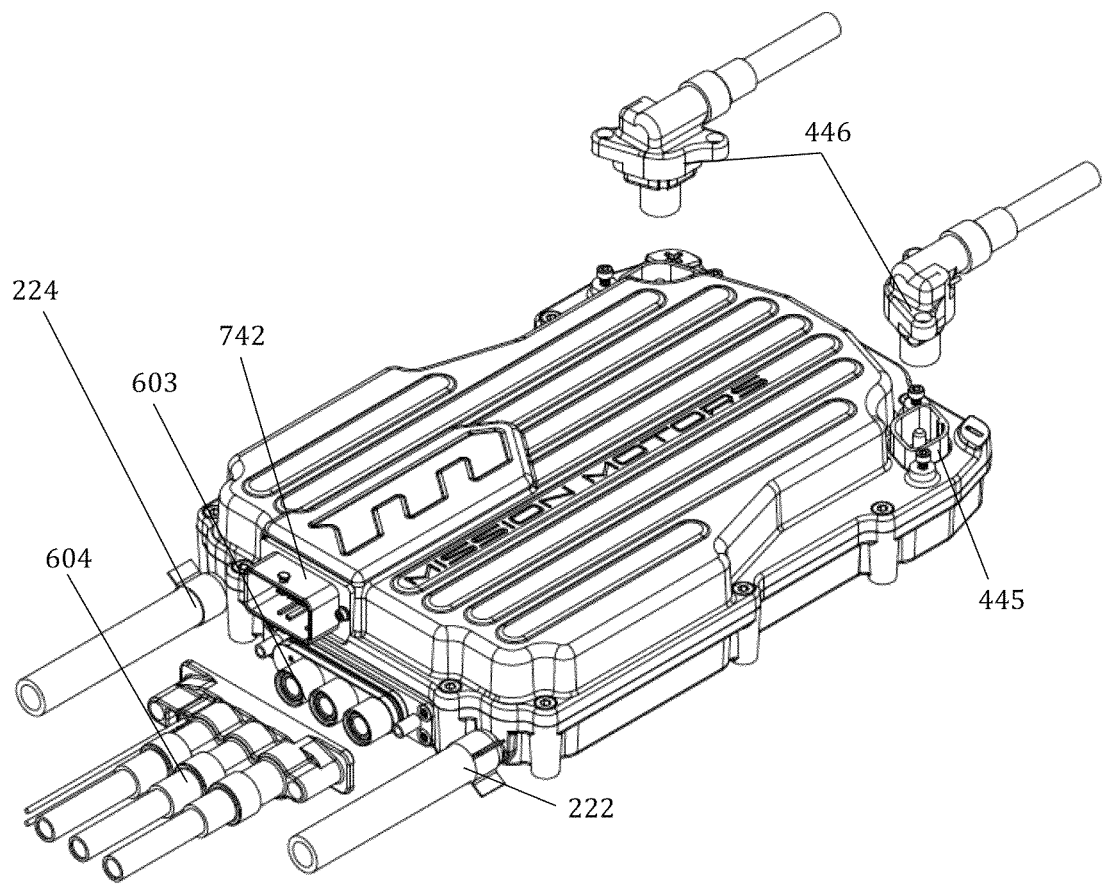
FIG. 9 is an exploded view of an assembled motor controller with auxiliary connections.

As aforementioned, motor controller 100 preferably includes a power input 440 that functions to receive power from the power source. The power input 440 preferably transfers power from the power source to the laminated bus 400. The power input 440 preferably includes a male connector 445 located on the motor controller 100 and a female connector 446 that receives the male connector 445. As shown in FIG. 8, the power input 440 preferably includes two male connectors 445, each located in a corner of the case 200 near the capacitor 300. However, the male connectors 445 may alternatively be located between the capacitor 300 and the inverter module 500, or in any other suitable location. As shown in FIG. 9, the power input 440 preferably includes two external female connectors 446 that plug into and couple the male connectors 445 to the positive and negative terminals of the power source, respectively, but may alternatively include one connector with two female connectors 446 that each couple to a male connector 445. However, the power input 440 may include any suitable number of female or male connectors. The power input 440 is preferably a DC power input, wherein the female and male connectors are DC connectors.

As shown in FIG. 8, the male connector 445 of the power input 440 preferably includes a male keyed connector 444 surrounding an input connector pin 442, wherein the connector pin 442 is coupled to the conductor pin 415 of the laminated bus 400. The connector pin 442 preferably screws on to the conductor pin 415, but may alternatively clip on (e.g. through an interference fit), be retained (e.g. by screws or a tongue-in-groove mechanism), or couple to the conductor pin 415 in any suitable manner. In the embodiment with two male connectors 445, each input connector pin 442 is preferably coupled to a different conductive layer of the laminated bus 400. The input connector pin 442 may be a banana plug, a spring pin, or any other suitable connector. The input connector pin 442 is preferably copper, but may alternatively be aluminum, gold, or any other suitable conductive metal. The male keyed connector 444 preferably has a polygonal profile to prevent connection misalignment, but may alternatively have an asymmetric profile (e.g. one portion that extends horizontally outward, is recessed, etc.) or any suitable feature that aligns the female and male connectors 445. The male keyed connector 444 preferably couples to the base 202 of the case 200 by four screws, but may alternatively couple to the case 200 with adherent, clips, or any suitable mechanism. The male keyed connector 444 is preferably insulated, and is preferably made of a polymeric material (e.g. PTFE, polyethylene, etc.), but may alternatively be made of insulated metal (e.g. powdered aluminum, polymer coated stainless steel, etc.). In one embodiment, the male keyed connector 444 has a rhomboid profile, and couples to the base 202 corner such that an extended diagonal of the keyed connector intersects the corner of the case 200. The male keyed connector 444 may additionally include a gasket to seal to the lid 204 of the case 200. When the case 200 is assembled, the male connector 445 preferably extends outside of the case 200. In one embodiment, the case lid 204 includes a hole through which the male connector 445 extends, and may additionally be recessed about the male connector 445 coupling site. The female connector 446 of the power input 440 preferably includes a female keyed connector 444, complimentary to that of the male keyed connector 444, and a power-transmitting wire or cable extending through the female connector 446 and terminating in a plug within the female keyed connector 444. The power-transmitting wire/cable preferably mates with the input connector pin 442 of the male connector 445 when the male connector 445 is plugged into the female connector 446. The female connector 446 may additionally include a low voltage interlock circuit to detect the connection state, wherein information indicative of the connection state may be transferred (preferably via wire) to the control or gate driver PCBs (710 and 720, respectively).

The power input 440 may additionally include a current sensor 448 that functions to measure the input current received from the power source. The current sensor 448 is preferably a Hall effect loop sensing PCB, and preferably surrounds the input connector pin 442. The current sensor 448 is preferably coupled to a male connector 445, and is preferably assembled between the gasket of the male connector 445 and the case base 202. In one embodiment, the input connector pin 442 is first coupled to the case base 202, then the input sensor is coupled to the case base 202, then the male keyed connector 444 is coupled over the input sensor to the case base 202. However, the current sensor 448 may alternatively be any suitable current sensor 448, and may alternatively be located in the female connector 446. The current sensor 448 may additionally include data wires that transmit data indicative of input current parameters (e.g. current) to the control or gate driver PCBs (710 and 720, respectively).

The motor controller 100 preferably does not include a rectifier circuit, as the power supply is preferably a single-phase, DC power supply. However, in the case 200 of a poly-phase power supply, the motor controller 100 may include a rectifier circuit including four, six, or any suitable number of diodes located between the power input 440 and capacitor 300.

Figure 7:
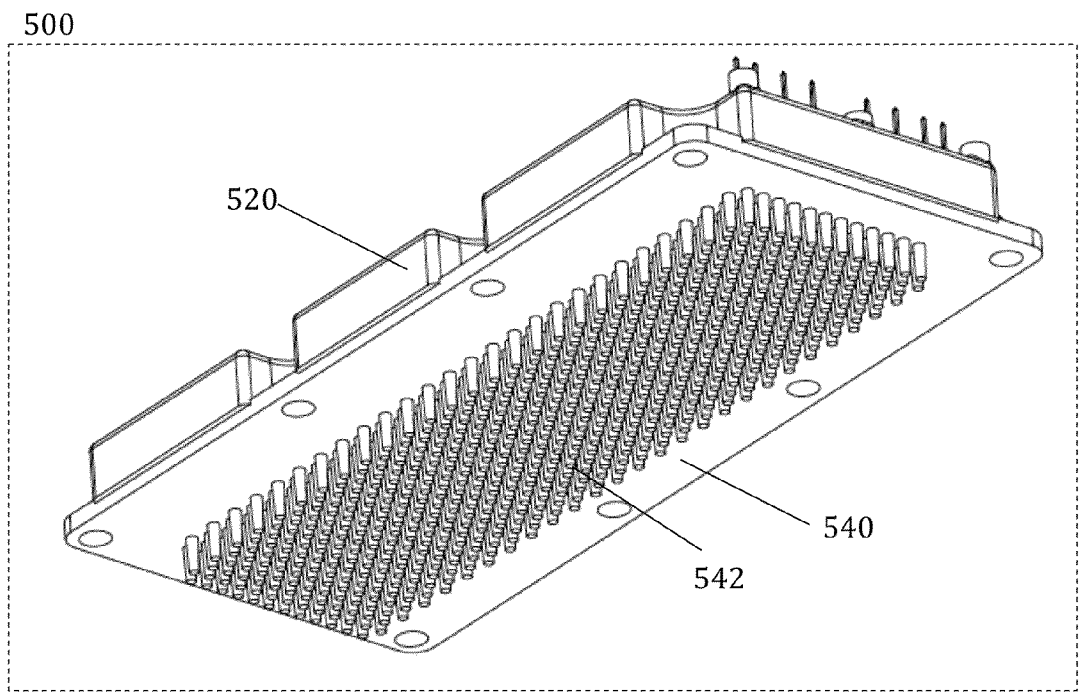
FIG. 7 is a perspective view of an embodiment of the inverter module.

As shown in FIG. 7, the inverter module 500 functions to convert the input power into output power. The inverter module 500 may additionally function to seal and define the cooling channel 220. The inverter module 500 includes an inverter circuit 520 coupled a baseplate 540, and may additionally include intermediate thermal interfaces and electric insulation layers. The inverter module 500 is preferably substantially the same length and width as the inverter circuit 520, and inverter module height is preferably substantially equivalent to the sum of the inverter circuit height and baseplate thickness, but may alternatively be taller. The inverter module 500 preferably includes three inverter inputs and three inverter outputs, but may alternatively include any suitable number of inverter inputs and outputs. The inverter inputs 504 each include a positive and negative terminal that are coupled to the conductive layers of the laminar bus coupled to the positive and negative terminals of the power supply, respectively. The inverter outputs 502 preferably include one output terminal coupled to a power connector bus bar 601. The inverter module 500 is preferably located in the inverter module portion 202a of the case 200, more preferably on top of the cooling channel 220 defined by the case base 202. The inverter module 500 is preferably oriented such that the output terminals are oriented proximal a case 200 sidewall (e.g. a transverse sidewall), and the input terminals are oriented towards the case interior/capacitor 300. However, the inverter module 500 may be oriented in any suitable position.

The inverter circuit 520 of the inverter module 500 functions to convert the input power from the power source into multi-phase (poly-phase) power suitable for use by the multi-phase load. The inverter circuit 520 preferably converts single-phase (DC) power, received from the capacitor 300, into three-phase AC power that is provided to the multi-phase load over a three-phase bus. However, the inverter circuit 520 may alternatively convert any suitable input power into any suitable multi-phase power. The inverter circuit 520 is preferably a module including six insulated gate bipolar transistors with six diodes in a standard full-bridge configuration, wherein each IGBT and diode is preferably made of multiple dies in parallel but may be made from any suitable arrangement. The inverter circuit 520 may alternatively include six silicon-controlled rectifiers (SCR's) or gate turn-off tyristors (GTO's) in full-bridge configuration, or any suitable number of suitable transistors and/or thyristors for the desired multi-phase power (e.g. four IGBTs and diodes in a full-bridge configuration to convert DC power to two-phase AC power). The inverter circuit 520 is preferably contained within an inverter module 500, wherein the module includes inverter inputs that couple to the laminated bus 400 and inverter outputs that couple to the power connector 600.

The inverter module 500 preferably includes a baseplate 540 that functions to transfer heat from the inverter circuit 520 to the cooling channel 220. The baseplate 540 is preferably a thin, prismatic, thermally conductive plate substantially the length and width of the inverter circuit 520, but may alternatively be larger or smaller. The baseplate 540 preferably includes cooling features that extend from a first broad face of the baseplate 540 (cooling face). The baseplate 540 is preferably coupled along the first broad face to the cooling channel 220, wherein the perimeter of the baseplate 540 is preferably mechanically coupled to the cooling channel walls to form a substantially fluid-impermeable seal. The baseplate 540 may be coupled to the cooling channel 220 by screws, clips, adherent, or any other suitable coupling mechanism. The cooling channel-baseplate join may additionally include a groove and a corresponding O-ring or grommet to create an improved fluid seal. In an assembled motor controller 100, the cooling features preferably extend into the cooling channel 220, such that the cooling fluid flowing within the cooling channel 220 adsorbs and removes heat from the inverter circuit 520. In one embodiment, the cooling features include a plurality of hollow tubes, arranged in a matrix, that extend at an angle (e.g. perpendicularly) from the cooling face. In a second embodiment, the cooling features include a plurality of solid tubes extending from the cooling face. In a third embodiment, the cooling features include a plurality of fins extending from the cooling face, wherein the fins may be straight, serpentine, or have any suitable pattern. The cooling features preferably extend along a majority of the cooling channel height, but may alternatively only extend a short distance into the cooling channel 220. The cooling features are preferably profiled and arranged along the baseplate 540 to compliment the cooling channel 220. For example, if the cooling channel 220 has a sloped floor, the cooling features near the deep portion of the cooling channel 220 may be longer than those near the shallow portion. In another example, the cooling features may be patterned in a boustrophedonic pattern when the cooling channel 220 is boustrophedonic.

The baseplate 540 preferably couples to the inverter circuit 520 along a second broad face (i.e. the broad face opposite that with the cooling features). The baseplate 540 is preferably bonded to the inverter circuit 520, but may alternatively be clipped to the inverter circuit 520, soldered to the inverter circuit 520, compressed against the inverter circuit 520 (e.g. the baseplate 540 is cambered, wherein application of a force along the baseplate edges compresses the baseplate face against the inverter circuit 520), or utilize any other suitable method of thermally coupling to the inverter circuit 520. The baseplate-inverter circuit interface may additionally include an electric insulator that electrically separates the inverter circuit 520 from the baseplate 540. The electric insulator is preferably ceramic, but may alternatively be polymeric or any suitable insulator. The inverter circuit 520 is preferably bonded to the electric insulator, but may alternatively be coupled to the insulator by friction, pressure, adherent, or any suitable coupling mechanism. The baseplate-inverter circuit interface may additionally include a thermal interface material, such as copper, thermal grease, or paste. In one embodiment, the inverter circuit 520 is bonded to a copper layer, which is bonded to a ceramic insulator, which is then bonded to the baseplate 540.

Figure 10:
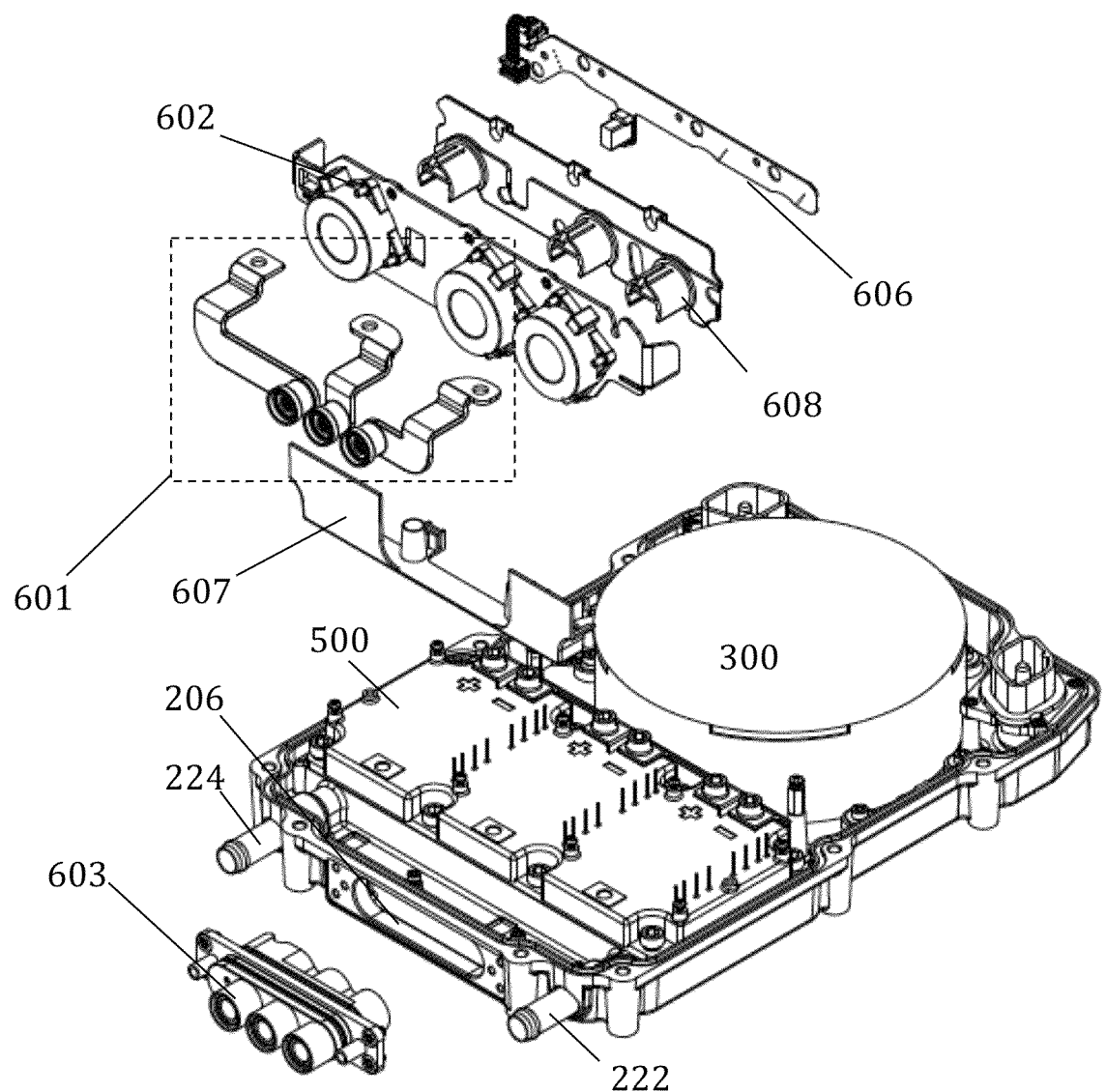
FIG. 10 is an exploded view of the power connector.

The power connector 600 of the motor controller 100 functions to facilitate multi-phase power output from the motor controller 100. As shown in FIG. 10, the power connector 600 is preferably coupled on one end to the inverter module output terminal 502 and coupled to an AC connector 603 on the other end. The power connector 600 is preferably a three-phase power connector 600, but may be any suitable connector for any number of power phases. The power connector 600 preferably includes a current sensor circuit 606, a current sensor 602, and a bus bar 601. The current sensor circuit 606 is preferably located on a current sensor PCB, and preferably receives current information from the current sensor 602 and provides information indicative of output current (processed or raw current data) to the gate driver 720 or control circuitry 710. The current sensor 602 is preferably a three-phase current sensor 602, and includes three Hall-effect loop sensors, but may be any suitable current sensor. The bus bar 601 is preferably a three-phase bus bar, and includes three bars that each extend through the center of a respective loop sensor to couple to an output of the inverter circuit 520. The bus bars 601 are preferably conductive, and may be copper, aluminum, gold, or any suitable conductive material. The bus bars 601 are preferably electrically insulated, and may be powder coated or covered with an insulation material. In one embodiment, the bus bars 601 further include case insulation 607 and sensor insulation 608. The case insulation 607 preferably lies between the bus bar 601 and the case 200 near the AC connector termination end, insulating the bus bars 601 from the case 200. The sensor insulation 608 preferably lies between the inverter circuit outputs 502 and extends through the current sensors 602, electrically insulating the bus bars from the sensors. The insulation is preferably substantially electrically inert, and may be made of polymers (e.g. rubber, PTFE, PET, etc.) or any other suitable material. The bus bars 601 couple to the ports of an AC connector 603, wherein the AC connector 603 is coupled to the exterior of the case 200 (e.g. by screws, clips, sliding into a groove, adherent, etc.) and extends through the power connection port to couple to the bus bar terminals. The AC connector 603 is preferably a three-phase AC connector with three terminals, and facilitates power transfer to the multi-phase load. The AC connector 603 preferably additionally includes a low voltage interlock circuit to detect the connection state.

A gate driver circuit 720 preferably controls the inverter circuit 520, wherein the gate driver circuit 720 functions to control the switching characteristics of the inverter circuit 520, and may additionally function to detect data relating to inverter circuit operation. Data relating to inverter circuit operation include the power input 440 (e.g. DC current input), multi-phase power output (e.g. AC current output magnitude, AC current output frequency, etc.), inverter module 500 temperature, and fault conditions, such as overcurrent, overvoltage, surpassing of a temperature threshold, faulty IGBT control, or any other suitable fault conditions. The gate driver circuit 720 preferably controls the inverter circuit 520 based on instructions received from the control circuit 710. The gate driver circuit is preferably located on a gate driver PCB (printed circuit board), which is preferably arranged above the inverter module 500 and couples to the inverter circuit 520 through pins extending vertically from the broad face of the inverter module 500.

The control circuit 710 of the motor controller 100 functions to generate and provide switching instructions to the gate driver circuit based on the load operation state. In particular, the control circuit 710 determines a desired switching characteristics based on the motor operation state and the desired torque. The motor operation state may be determined from the motor position, speed, temperature, acceleration, any other motor parameter, or a combination thereof. The desired torque is preferably determined from the throttle position, and may be a predetermined value mapped to a given throttle position, a torque calculated from the detected throttle position, or a torque value determined in any other suitable manner by the control circuitry 710. The throttle position is preferably communicated to the control circuitry 710 from a remote PCB (e.g. vehicle control circuitry, vehicle controller, throttle circuitry, etc.) via a controller area network bus (CAN bus), wherein the remote PCB receives data indicative of the substantially instantaneous throttle position from the throttle or an associated sensor. Alternatively, the remote/external PCB may determine (e.g. select, calculate, etc.) and communicate the desired torque value to the control circuitry 710 over the CAN bus or any suitable means (e.g. wireless communication, near-field communication, etc.). The desired torque may alternatively be determined based on any other suitable motor operation state or vehicle operation state (e.g. external temperature, auxiliary power draw, etc.). The control circuit 710 then provides signals to the gate drive circuit to switch the inverter circuit 520 at the determined switching characteristic. The control circuit 710 may additionally receive motor performance data, and may control the motor accordingly. Motor performance data is preferably data indicative of present motor operation, but may be data indicative of desired motor operation. For example, the control circuit 710 may receive data from the motor encoder, resolver, and sensors (e.g. temperature, pressure, cooling fluid level, etc.), and/or may receive vehicle data such as throttle position, transmission data, state of charge of an auxiliary battery, data related to auxiliary functionalities (e.g. climate control, seat control, door locks, etc.). The control circuit 710 may then adjust the switching characteristics, power output, relay control, auxiliary functions (e.g. lights, fans, pumping rate, etc.), send appropriate signals to the controller area network (CAN), or control any other suitable functions accordingly. The control circuit 710 is preferably located on an individual PCB, but may be located on the same board as another circuit. The control circuit 710 is preferably located above the inverter module 500, more preferably directly above of the gate driver PCB, wherein a wired cable communicates signals from the control circuit 710 to the gate driver circuit 720. However, the control circuit 710 may be arranged in any suitable configuration or position within the motor controller 100, and may be connected to the gate driver circuit 720 through a spring leaf connection, a pin connection, or any other suitable connection. The control circuit 710 is preferably coupled to the case lid 204 through screws, clips, or any suitable coupling mechanism, but may be coupled to the case base 202, the gate driver circuit 720, the wall, or any suitable portion of the motor controller 100.

The control circuit 710 preferably sends and receives signals to and from the motor and/or vehicle through a signal controller 740. The signal controller 740 preferably additionally includes a signal connector 742 and a signal circuit 744 located on a signal PCB, wherein the signal circuit 744 functions to communicate data between the signal controller 740 and the control circuit 710. The signal circuit 744 may additionally function to process the received signal data into summary data, or parcel out instructions sent from the control circuit 710 to the appropriate component. The signal connector 742 is preferably coupled to the motor, and may additionally be coupled to the vehicle. For example, the signal connector 742 may be connected to the motor encoder, the motor resolver, the motor temperature sensor input, the motor controller 100 temperature sensor input, the throttle, the CAN communication, the 12V power, auxiliary switches, knobs, and sensors, the relay control, the transmission, or any auxiliary components such as lights, or fans. The signal connector 742 is preferably soldered to the signal PCB, wherein the signal PCB/connector assembly is preferably screwed, adhered, or otherwise coupled to the case lid 204. The lid 204 preferably includes a port through which the signal connector 742 extends such that it may access external components.

As a person skilled in the art will recognize from the previous detailed description and from the figures and claims, modifications and changes can be made to the preferred embodiments of the invention without departing from the scope of this invention defined in the following claims.

We claim:

1. A motor controller comprising:
   an inverter module comprising:
     an inverter circuit with a first and second broad face;
     a baseplate having a first broad face coupled to the first broad face of the inverter circuit, a second broad face, and a plurality of cooling features extending from the second broad face of the baseplate;
     a cooling channel, comprising an inlet and an outlet, that is configured to receive a cooling fluid, wherein the cooling channel is cooperatively defined by a raised portion of a case accommodating the inverter circuit and by the second broad face of the baseplate, wherein the cooling features extend into the cooling channel such that the cooling fluid flows across the cooling features;
   a capacitor; and
   a laminated bus electrically coupling the capacitor to the inverter circuit and thermally coupling the capacitor to the cooling channel.

2. The motor controller of claim 1, wherein the cooling channel is a reservoir, wherein the reservoir facilitates one-way flow from the inlet to the outlet.

3. The motor controller of claim 2, wherein the reservoir has substantially the same length and width as the inverter circuit.

4. The motor controller of claim 1, wherein the cooling features comprise a plurality of cylindrical tubes.

5. The motor controller of claim 4, wherein the tubes are arranged in a matrix along the baseplate broad face.

6. The motor controller of claim 1, wherein the inverter module further comprises a thermal interface between the inverter circuit and the baseplate.

7. The motor controller of claim 6, wherein the inverter module further comprises an electric insulator between the inverter circuit and the baseplate.

8. The motor controller of claim 7, wherein the first broad face of the inverter circuit is joined to a copper plate.

9. The motor controller of claim 8, wherein the copper plate is joined to a ceramic insulator, and the ceramic insulator is coupled to the baseplate.

10. The motor controller of claim 1, wherein the inverter circuit is oriented within the case such that a longitudinal edge of the inverter circuit parallels a transverse edge of the case, and wherein the capacitor is located adjacent to the inverter circuit within the case, wherein the capacitor is substantially centered between along the inverter circuit length.

11. The motor controller of claim 1, wherein the capacitor is a film capacitor.

12. The motor controller of claim 1, wherein the laminated bus extends along a wall of the cooling channel and underneath a flat end of the capacitor.

13. The motor controller of claim 1, wherein the inverter circuit converts DC power into three-phase AC power, and comprises six IGBTs and six diodes in a full-bridge configuration.

14. The motor controller of claim 13, wherein each IGBT and diode comprise multiple dies in parallel.

15. The motor controller of claim 1, wherein the inlet and outlet are located on the corners of a transverse wall of the case.

16. The motor controller of claim 15, wherein the motor controller further comprises a power output connector coupled to the case between the inlet and outlet.

17. The motor controller of claim 1, wherein the motor controller further comprises a control circuit, wherein the control circuit controls the switching characteristics of the inverter circuit based on data indicative of motor operation and a torque value.

18. The motor controller of claim 17, wherein the data indicative of motor operation is the motor rotation speed.

19. The motor controller of claim 17, wherein the torque value is determined from a throttle position.

20. The motor controller of claim 19, wherein the torque value is received by the control circuit from a remote circuit over a controlled area network bus.

21. A motor controller comprising:
    an inverter module comprising:
      an inverter circuit with a first and second broad face;
      a baseplate having a first broad face coupled to the first broad face of the inverter circuit, a second broad face, and a plurality of cylindrical tubes extending from the second broad face of the baseplate and arranged in a matrix;
      a thermal interface between the inverter circuit and the baseplate; and
      an electric insulator between the inverter circuit and the baseplate
    a reservoir, comprising an inlet and an outlet, that is configured to receive a cooling fluid, wherein the reservoir is cooperatively defined by a raised portion of a case accommodating the inverter circuit and by the second broad face of the baseplate, wherein the cylindrical tubes extend into the reservoir such that the cooling fluid flows across the cylindrical tubes, wherein the reservoir facilitates one-way flow from the inlet to the outlet, wherein the reservoir has substantially the same length and width as the inverter circuit;
    a capacitor; and
    a laminated bus electrically coupling the capacitor to the inverter circuit and thermally coupling the capacitor to the reservoir, wherein the laminated bus extends along a wall of the reservoir and underneath a flat end of the capacitor.

* * * * *